(12) United States Patent
Gutsche et al.

(10) Patent No.: US 7,456,461 B2
(45) Date of Patent: Nov. 25, 2008

(54) STACKED CAPACITOR ARRAY AND FABRICATION METHOD FOR A STACKED CAPACITOR ARRAY

(75) Inventors: Martin Gutsche, Dorfen (DE); Harald Seidl, Poering (DE); Peter Moll, Dresden (DE)

(73) Assignee: Infineon Technologies AG, Munich (DE)

( * ) Notice: Subject to any disclaimer, the term of this patent is extended or adjusted under 35 U.S.C. 154(b) by 411 days.

(21) Appl. No.: 11/112,940

(22) Filed: Apr. 22, 2005

(65) Prior Publication Data

US 2005/0245022 A1    Nov. 3, 2005

(51) Int. Cl.
*H01L 27/108* (2006.01)
*H01L 29/76* (2006.01)
*H01L 29/94* (2006.01)
*H01L 31/119* (2006.01)

(52) U.S. Cl. ............... 257/306; 257/303; 257/E21.229; 257/E21.396; 257/E21.648

(58) Field of Classification Search ................. 257/306, 257/300, 301, 303, 307, 308, 310, 639, 640, 257/649, 650, 296
See application file for complete search history.

(56) References Cited

U.S. PATENT DOCUMENTS

| | | | |
|---|---|---|---|
| 5,330,614 A | 7/1994 | Ahn | |
| 5,753,949 A | 5/1998 | Honma et al. | |
| 5,824,592 A | 10/1998 | Tseng | |
| 5,946,571 A | 8/1999 | Hsue et al. | |
| 6,008,514 A | 12/1999 | Wu | |
| 6,025,246 A | 2/2000 | Kim | |
| 6,156,608 A | 12/2000 | Chen | |
| 6,303,956 B1 | 10/2001 | Sandhu et al. | |
| 6,395,600 B1 * | 5/2002 | Durcan et al. | ............... 438/253 |
| 6,403,418 B2 | 6/2002 | Wang et al. | |
| 6,403,442 B1 | 6/2002 | Reinberg | |
| 6,489,195 B1 | 12/2002 | Hwang et al. | |
| 6,563,190 B1 | 5/2003 | Lee et al. | |
| 6,617,222 B1 | 9/2003 | Coursey | |
| 6,667,502 B1 | 12/2003 | Agarwal et al. | |
| 6,667,505 B2 * | 12/2003 | Narimatsu et al. | .......... 257/303 |
| 7,053,435 B2 | 5/2006 | Yeo et al. | |
| 7,112,487 B2 | 9/2006 | Gutsche et al. | |
| 2002/0094617 A1 | 7/2002 | Taniguchi | |

(Continued)

FOREIGN PATENT DOCUMENTS

DE    199 50 364 A1    4/2001

(Continued)

OTHER PUBLICATIONS

German Office Action dated Dec. 6, 2004.
Drynan et al., "Cylindrical Full Metal Capacitor Technology for High-Speed Gigabit DRAMs," *Symposium on VLSI Technology Digest of Technical Papers*, pp. 151-152, 1997.

(Continued)

*Primary Examiner*—David Nhu
(74) *Attorney, Agent, or Firm*—Slater & Matsil, L.L.P.

(57) ABSTRACT

The present invention relates to a stacked capacitor array and a fabrication method for a stacked capacitor array having a multiplicity of stacked capacitors, an insulator keeping at least two adjacent stacked capacitors mutually spaced apart, so that no electrical contact can arise between them and the stacked capacitors are mechanically stabilized.

14 Claims, 16 Drawing Sheets

U.S. PATENT DOCUMENTS

| | | |
|---|---|---|
| 2002/0149043 A1 | 10/2002 | Willer et al. |
| 2003/0001180 A1 | 1/2003 | Narimatsu et al. |
| 2003/0227044 A1 | 12/2003 | Park |
| 2005/0054159 A1 | 3/2005 | Manning et al. |
| 2005/0245022 A1 | 11/2005 | Gutsche et al. |
| 2005/0245027 A1 | 11/2005 | Gutsche et al. |

FOREIGN PATENT DOCUMENTS

| | | |
|---|---|---|
| DE | 102 12 868 A1 | 1/2003 |
| DE | 10 2004 045 492 A1 | 5/2005 |
| DE | 10 2004 055 463 A1 | 8/2005 |
| JP | 10212868 | 1/2003 |
| KR | 1020010083563 | 9/2001 |

OTHER PUBLICATIONS

Hatakeyama et al., "A 256-Mb SDRAM Using a Register-Controlled Digital DLL," *IEEE J. Solid State Circ.*, vol. 32, No. 11, pp. 1728-1732, Nov. 1997.

Kaga et al., "Crown-Shaped Stacked-Capacitor Cel for 1.5-V Operation 64-Mb DRAM's," *IEEE Trans. Electron Devices*, vol. 38, No. 2, pp. 255-260, Feb. 1991.

Kaga et al., "Crown-Shaped Stacked-Capacitor Cell for 1.5-V Operation 64-Mb DRAM's," *IEEE Trans. Electron Devices*, vol. 38, No. 2, pp. 255-260, Feb. 1991.

* cited by examiner

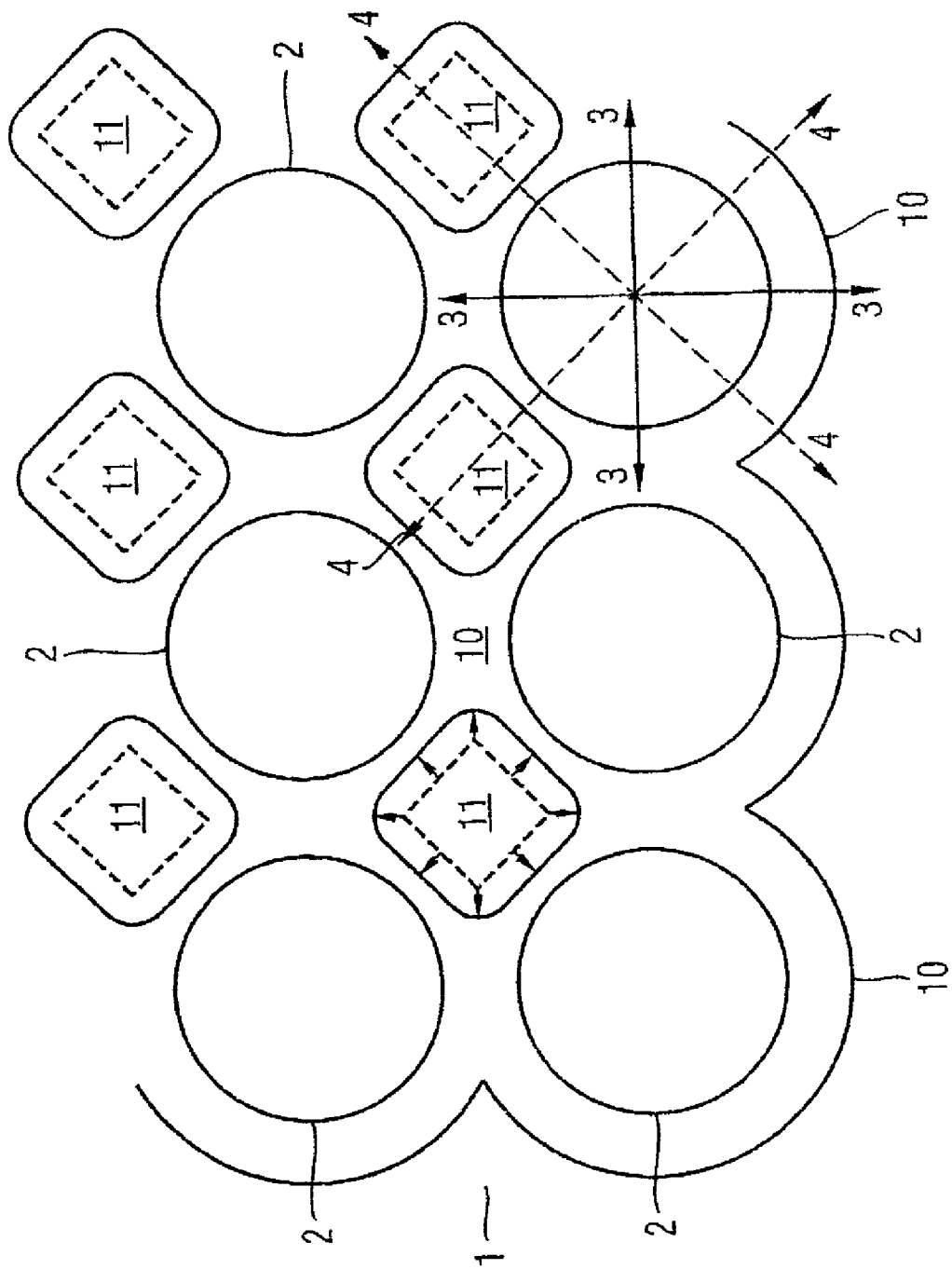

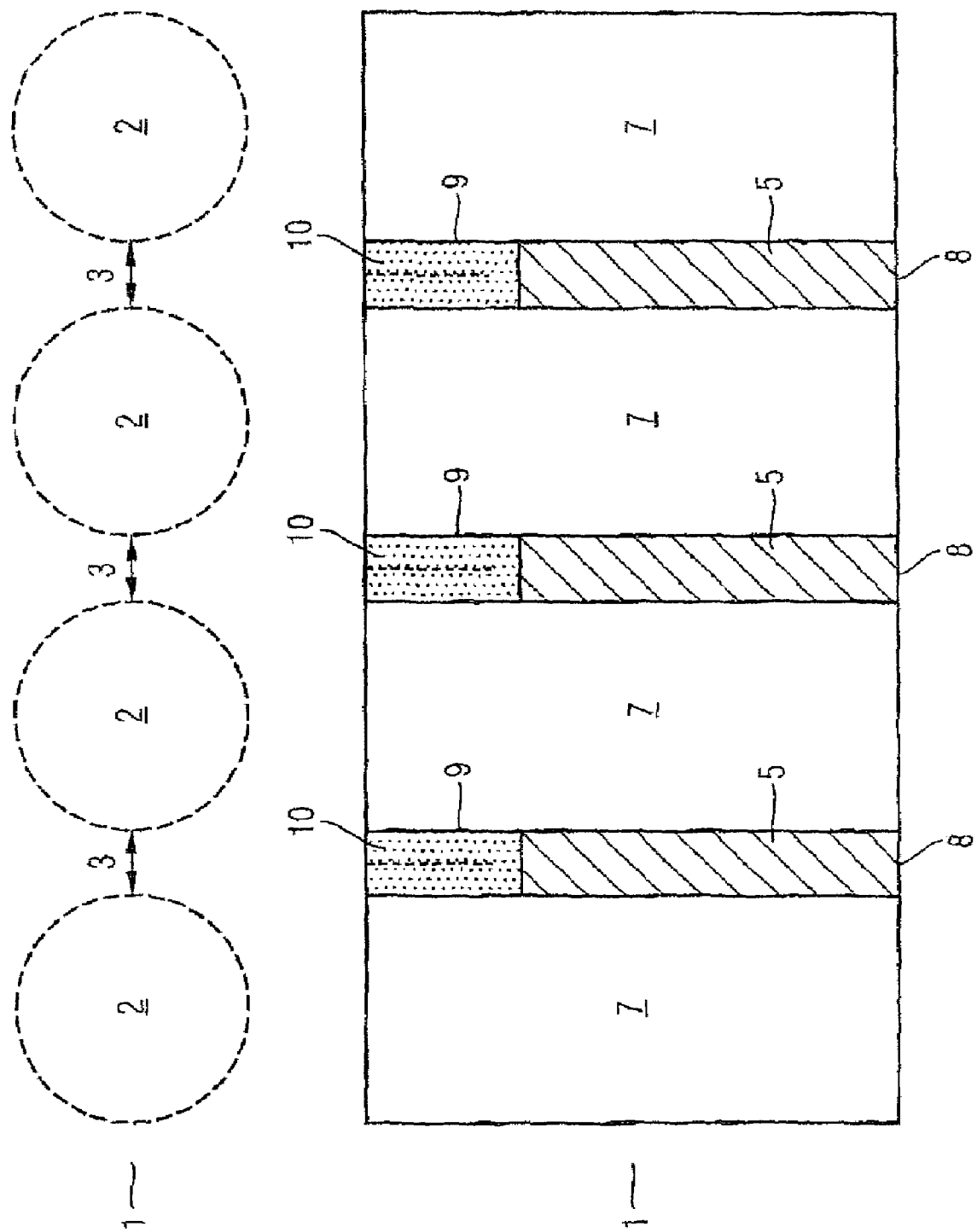

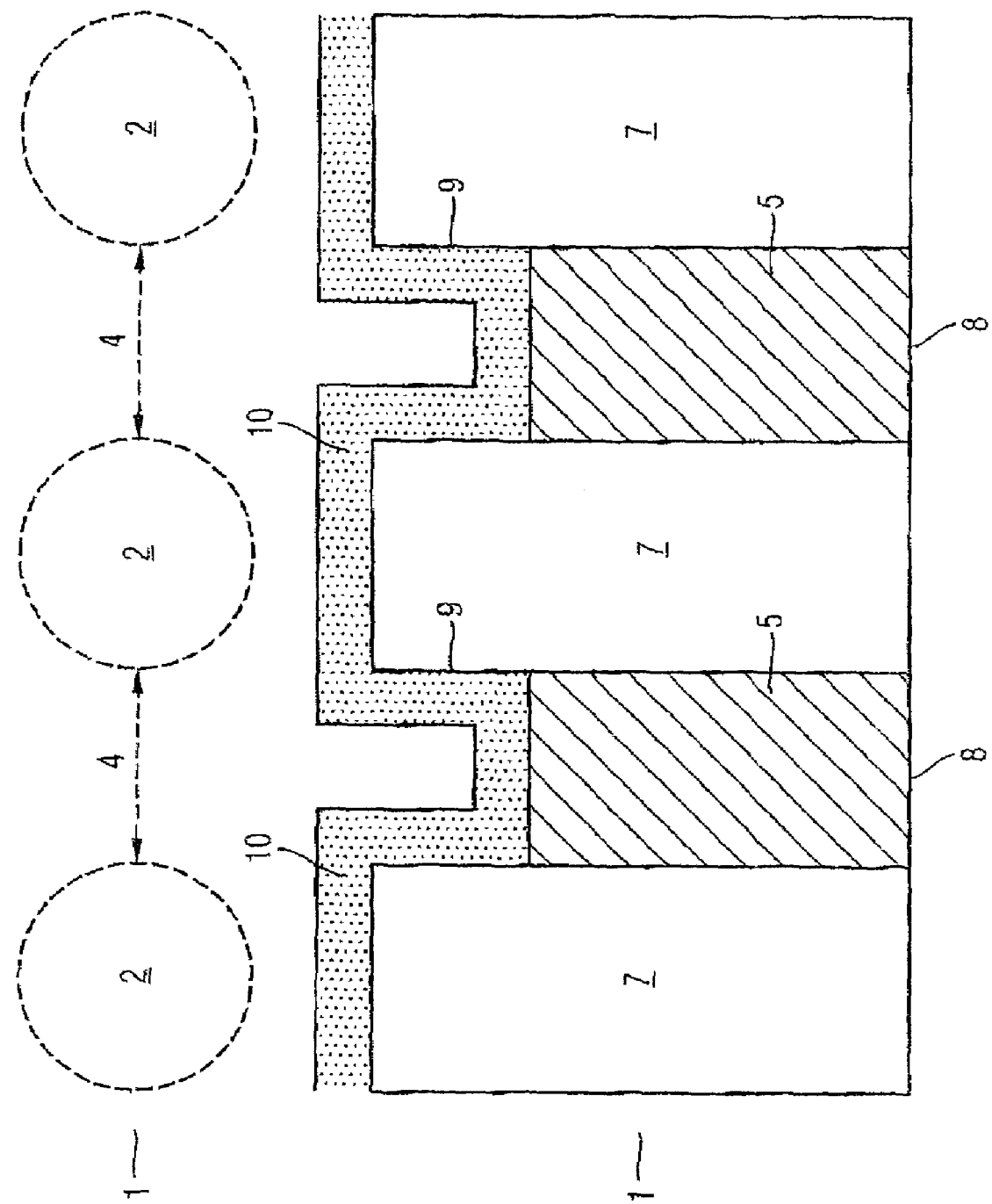

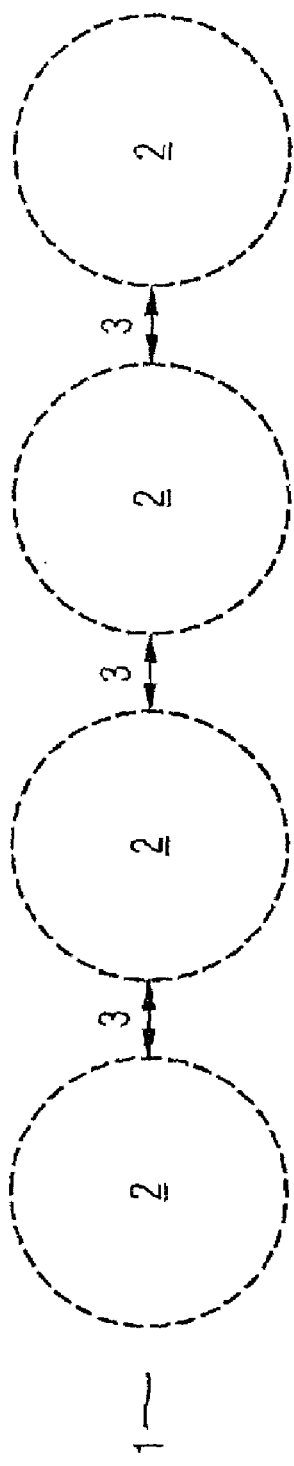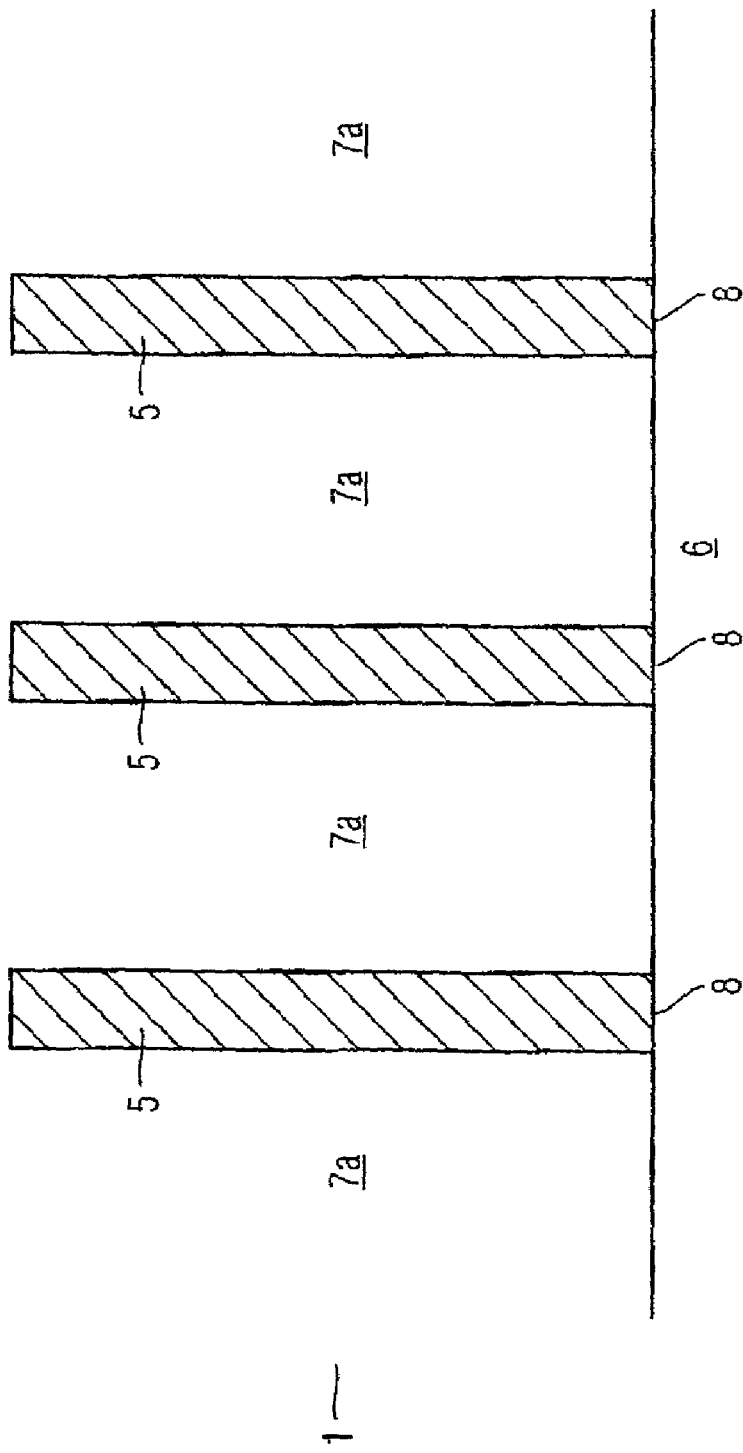
FIG 4B

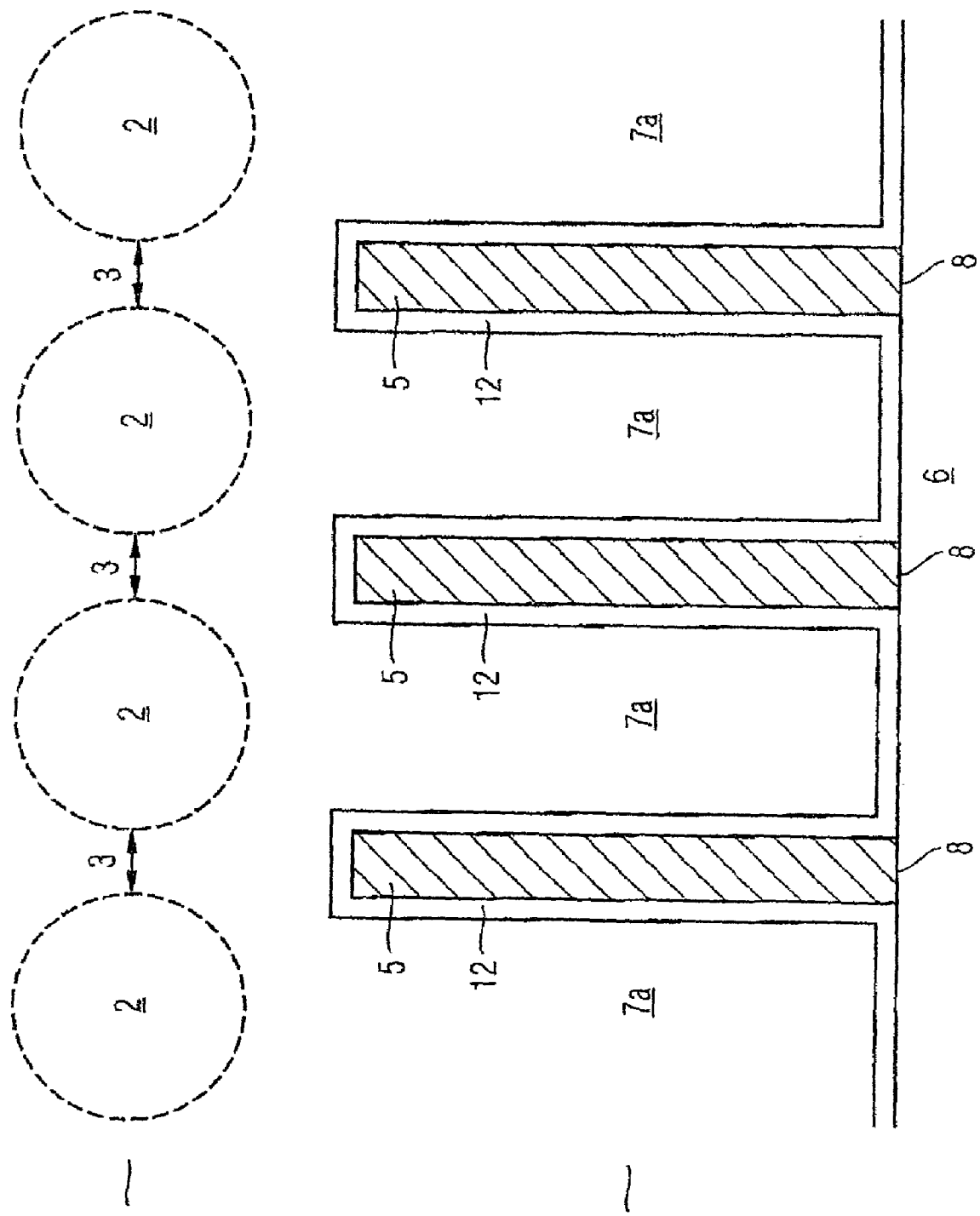

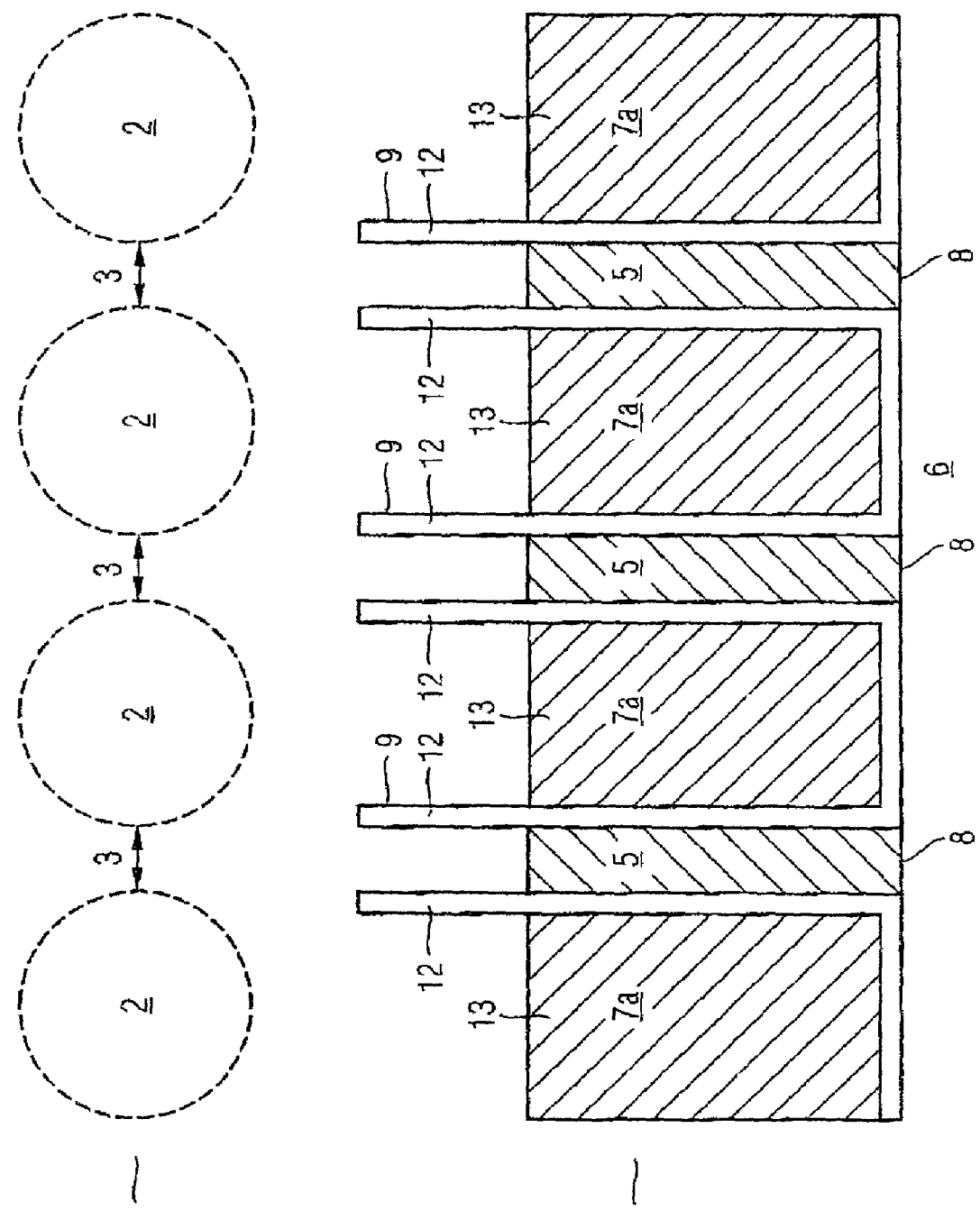

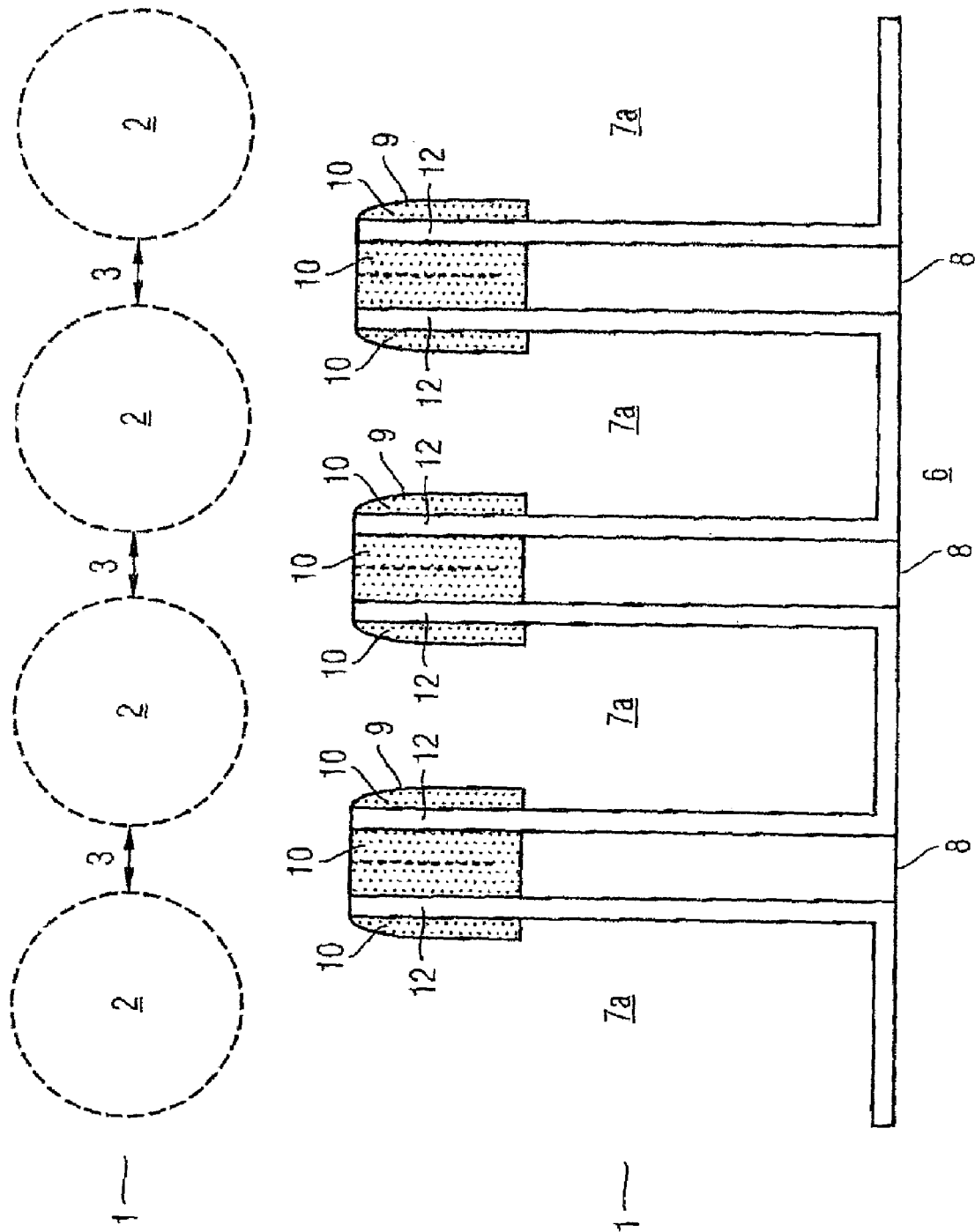

STACKED CAPACITOR ARRAY AND FABRICATION METHOD FOR A STACKED CAPACITOR ARRAY

TECHNICAL FIELD

The present invention relates to a stacked capacitor array and a fabrication method for a stacked capacitor array.

BACKGROUND

Although applicable in principle to arbitrary integrated circuits, the present invention and also the problem area on which it is based will be explained with regard to integrated memory circuits, in particular DRAM cells, in silicon technology.

A stacked capacitor array has a multiplicity of stacked capacitors which are preferably arranged regularly. As is known, a stacked capacitor is preferably connected to a transistor below the capacitor in order to form a DRAM cell. In the known fabrication of stacked capacitors, and particularly of cylindrical stacked capacitors, in a stacked capacitor array, there is the problem that as the aspect ratio of the individual stacked capacitors increases, their mechanical stability decreases. If the aspect ratio of pillar like or crown like capacitors increases above a specific value, then the structures become mechanically unstable. In a disadvantageous manner, capacitors may incline toward one another on account of this instability. If two neighboring capacitors incline toward one another to such an extent that they touch one another, a short circuit arises between these two capacitors, and memory errors occur within a stacked capacitor array. With a lack of mechanical stability, stacked capacitors may also completely topple over and thus bring about defects within the stacked capacitor array.

This problem has been solved hitherto by keeping the aspect ratio of the individual capacitor below a limit value determined empirically. The capacitance that can be achieved per capacitor is thereby limited, however. In order to further improve the large scale integration of memory circuits, however, it is necessary to increase the capacitance of the respective capacitor per chip area by increasing the aspect ratio.

SUMMARY OF THE INVENTION

The present invention is based on the object, then, of providing a stacked capacitor array in which the stacked capacitors of the stacked capacitor array cannot mutually touch one another.

According to the invention, objectives of a stacked capacitor array and method are achieved.

The idea on which the present invention is based essentially consists in providing a stacked capacitor array having a multiplicity of stacked capacitors, and an insulator keeping at least two adjacent stacked capacitors mutually spaced apart, so that no electrical contact can arise between them.

One advantage of the present invention is that the insulator insulates two adjacent stacked capacitors from one another such that no electrical contact can arise between them even if they incline toward one another. Short circuits between the adjacent stacked capacitors are thus avoided.

In accordance with one preferred embodiment, the insulator keeps many or all adjacent stacked capacitors spaced apart.

With a further preferred embodiment, the insulator contacts at least two adjacent stacked capacitors to one another and thus mechanically stabilizes them mutually. Two stacked capacitors connected by means of the insulator are mechanically stabilized and cannot incline toward one another or tip over.

In accordance with a further preferred embodiment, the insulator contacts many or all adjacent stacked capacitors to one another and thus mechanically stabilizes them.

In accordance with a further preferred embodiment, the insulator is provided at the upper end of the adjacent stacked capacitors.

In accordance with a further preferred embodiment, the multiplicity of stacked capacitors is arranged regularly, a stacked capacitor having a smaller spacing from the respective adjacent stacked capacitors in specific first directions than in specific second directions, the insulator keeping spaced apart at least two stacked capacitors that are adjacent in the first direction.

The present object is achieved by providing the following method for fabricating a stacked capacitor array having a regular arrangement of a multiplicity of stacked capacitors. The stacked capacitor having a smaller spacing from the respective adjacent stacked capacitors in specific first directions than in specific second directions by providing a first auxiliary layer on a substrate, providing a respective cylinder for each stacked capacitor in the first auxiliary layer in accordance with the regular arrangement, the first auxiliary layer remaining only in intermediate regions between the cylinders, etching back the first auxiliary layer in an upper region of the intermediate regions; depositing an insulator in the upper region of the intermediate regions; etching back the insulator, so that in each case two stacked capacitors that are adjacent in the first direction are in contact with and supported by means of the insulator and so that in each case a hole is formed through the insulator between two stacked capacitors that are adjacent in the second direction. The first auxiliary layer is removed by means of the holes formed in the intermediate regions. The stacked capacitor array is then completed.

One advantage of the present invention is that the individual stacked capacitors are spaced apart from one another by the use of the insulator, so that individual stacked capacitors cannot touch one another and short circuits between the stacked capacitors are thus avoided. Moreover, in the case of the individual stacked capacitors being supported by the insulator, the mechanical stability of the individual stacked capacitors is improved even with a high aspect ratio.

In accordance with one preferred embodiment, the cylinder for each stacked capacitor is formed as a solid cylinder composed of an electrode material. The solid cylinder is then utilized as an electrode of the capacitor. One advantage of this preferred development is that the fabrication method according to the invention is also suitable for such solid cylinders, which permit a very large scale integration of the memory circuits.

In accordance with a further preferred embodiment, the cylinder for each stacked capacitor is formed as a hollow cylinder, which is etched through the first auxiliary layer in accordance with the regular arrangement.

One advantage of these preferred embodiments is that the fabrication method according to the invention can be used variably both for hollow and for solid cylinders or for a combination of the two.

In accordance with a further preferred embodiment, the etching of the hollow cylinders is carried out by means of a dry etching process and/or a wet-chemical etching process. Etching of the hollow cylinders is advantageously carried out by means of a combined sequence of both processes.

In accordance with a further preferred embodiment, before the first auxiliary layer is etched back, a first electrode layer is deposited into the hollow cylinders for the purpose of forming crown-type first electrodes for the stacked capacitors. The hollow cylinders are subsequently filled with a first filling. The electrode layer deposited in the hollow cylinder forms a first electrode for the respective stacked capacitor, such that the electrode has the form of a crown. One advantage of this preferred embodiment is that, as a result of the deposition of the electrode layer and as a result of filling with the first filling, the hollow cylinders are stabilized in such a way as to ensure their mechanical stability during the etching back of the first auxiliary layer and also during subsequent method steps.

In accordance with a further preferred embodiment, the first auxiliary layer is formed by silicon or by silicon oxide. One advantage of this preferred embodiment is that both silicon and silicon oxide are readily etchable and it is thus possible to carry out the fabrication of the cylinders for the stacked capacitors in a simple manner.

In accordance with a further preferred embodiment, the first auxiliary layer is formed by a superimposition of an undoped silicate glass layer and a borosilicate glass layer. It is known that, in a disadvantageous manner, generally a cone rather than a cylinder arises in the course of dry etching through a specific layer. By virtue of the fact, however, that during the subsequent wet-chemical etching or expansion, the borosilicate glass layer has a higher etching rate with respect to the undoped silicon glass layer, the conical form is avoided and a substantially cylindrical form is formed after etching.

In accordance with a further preferred embodiment, the etching back of the insulator may be carried out by means of either an anisotropic or an isotropic etching process or both. One advantage of this preferred embodiment is that the thickness of the insulator can be set as desired through the variable use of isotropic and anisotropic etching processes.

In accordance with a further preferred embodiment, the insulator is formed by silicon nitride.

In accordance with a further preferred embodiment, the insulator is formed by aluminum oxide.

In accordance with a further preferred embodiment, the first filling is formed by silicon glass. The first filling advantageously fulfills the function of increasing stability during subsequent planarization processes (etching back processes, chemical mechanical polishing).

In accordance with a further preferred embodiment, the regular arrangement is checkered, both the first directions and the second directions in each case being oriented perpendicular to one another.

In accordance with a further preferred embodiment, the cylinders have an elliptical or a rectangular cross section.

In accordance with a further preferred embodiment, the insulator is deposited only on the outside around the cylinder. In an advantageous manner, by virtue of the fact that no insulator is deposited inside the cylinder for the stacked capacitor, the area of the capacitor and thus the capacitance of the capacitor are increased.

In accordance with a further preferred embodiment, the insulator is deposited on the outside around the cylinder and on the inside. One advantage of this preferred development is that the processing of the stacked capacitor array is thus simplified. Simplifying the processing saves costs.

In accordance with a further preferred embodiment, the insulator surrounds the corresponding stacked capacitor only in insulating fashion and does not connect two adjacent stacked capacitors to one another.

BRIEF DESCRIPTION OF THE DRAWINGS

Exemplary embodiments of the invention are illustrated in the drawings and are explained in more detail in the description below:

FIG. 1 shows a schematic illustration of a plan view of a stacked capacitor array according to the invention;

FIGS. 2a-2c show schematic illustrations of successive method stages of a fabrication method according to a first embodiment of the present invention, wherein the stacked capacitors that are adjacent in first directions are illustrated;

FIGS. 3a-3e show schematic illustrations of successive method stages of the fabrication method according to the first embodiment of the present invention, wherein the stacked capacitors that are adjacent in second directions are illustrated; and FIGS. 4a-4g show schematic illustrations of successive method stages of a fabrication method as a second embodiment of the present invention.

DETAILED DESCRIPTION OF ILLUSTRATIVE EMBODIMENTS

Figure 2A:
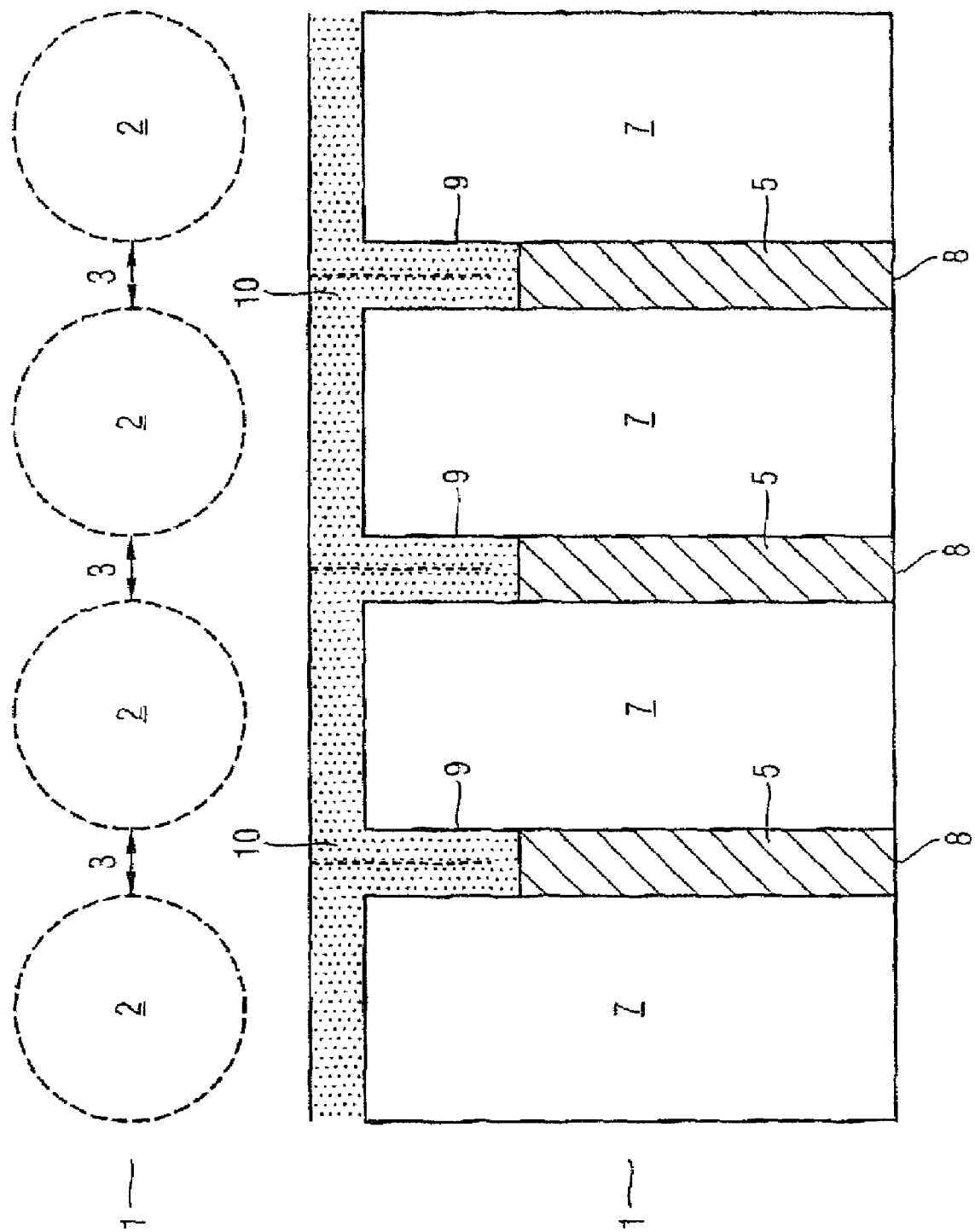

In the figures of the drawings, identical or functionally identical elements and layers have been provided with the same reference symbols unless specified otherwise.

FIG. 1 shows a schematic illustration of a plan view of a stacked capacitor array according to the invention. Reference symbol 1 designates the stacked capacitor array according to the invention, which has six stacked capacitors 2 in the detail from the stacked capacitor array 1 shown. A stacked capacitor 2 preferably has a smaller spacing from the respective adjacent stacked capacitors 2 in specific first directions 3 than in specific second directions 4. The regular arrangement of the stacked capacitors 2 in the stacked capacitor array 1 is preferably checkered, and both the first directions 3, such as for example the rows and columns shown in FIG. 1, and the second directions 4, which are diagonal to the first directions 3, are perpendicular to one another. Any other regular arrangement is likewise conceivable.

The plan view according to FIG. 1 of the stacked capacitor array 1 shows the stacked capacitors 2 in each case surrounded by an insulator 10, so that in each case two stacked capacitors 2 that are adjacent in the first direction 3 are supported by means of the insulator 10 filling the space between the capacitor and so that in each case the insulator 10 does not fill the space between, such that a hole 11 is formed through the insulator 10 between two stacked capacitors 2 that are adjacent in the second direction 4. It is shown hereinafter that any auxiliary layers which are situated below the insulator 10 can be removed by means of the holes 11, for instance by the use of isotropic etching methods.

Figure 2B:
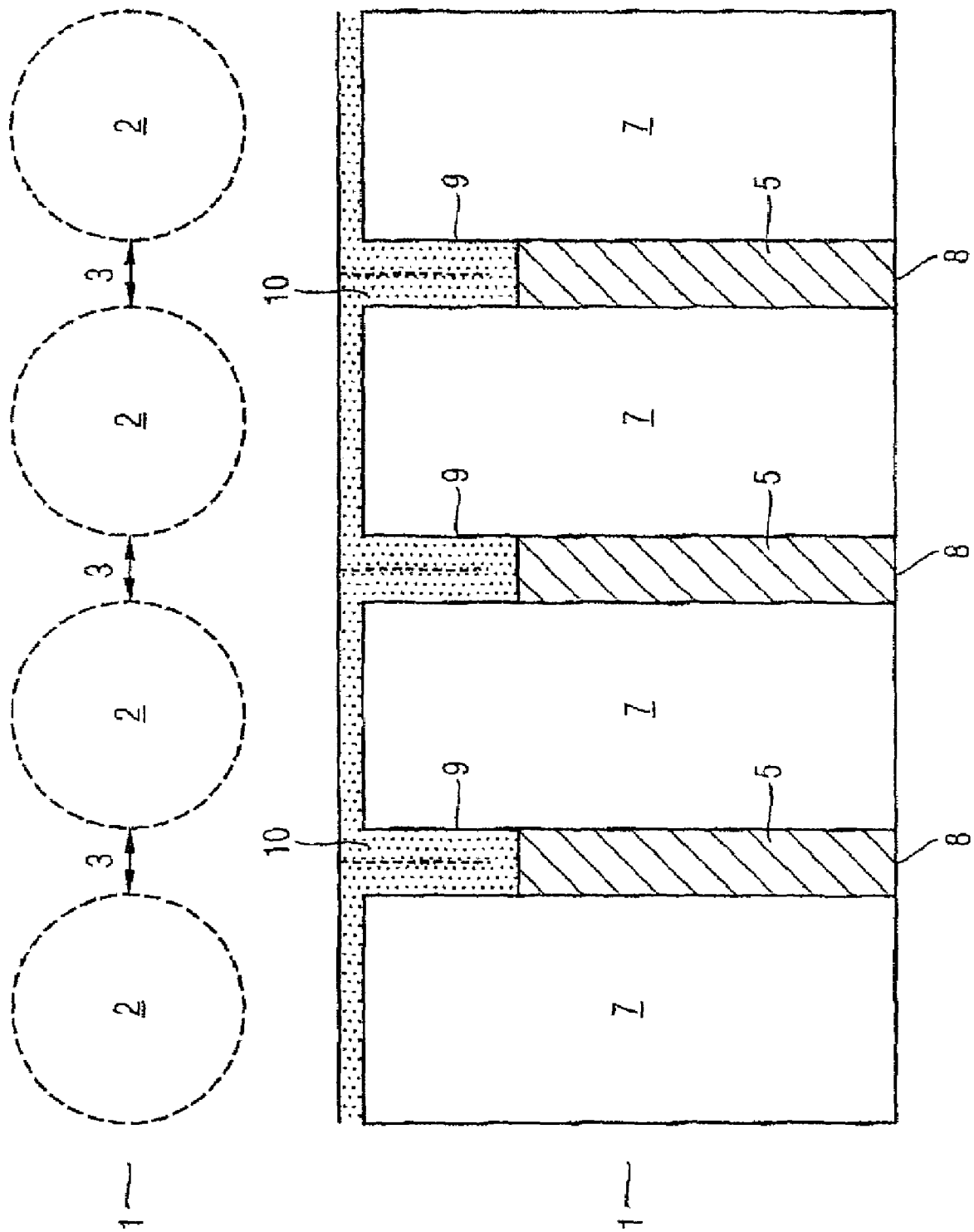

FIGS. 2a-2c show schematic illustrations of successive method stages of a fabrication method as first embodiment of the present invention. The stacked capacitors 2 that are adjacent in first directions 3 being illustrated.

Figure 3B:
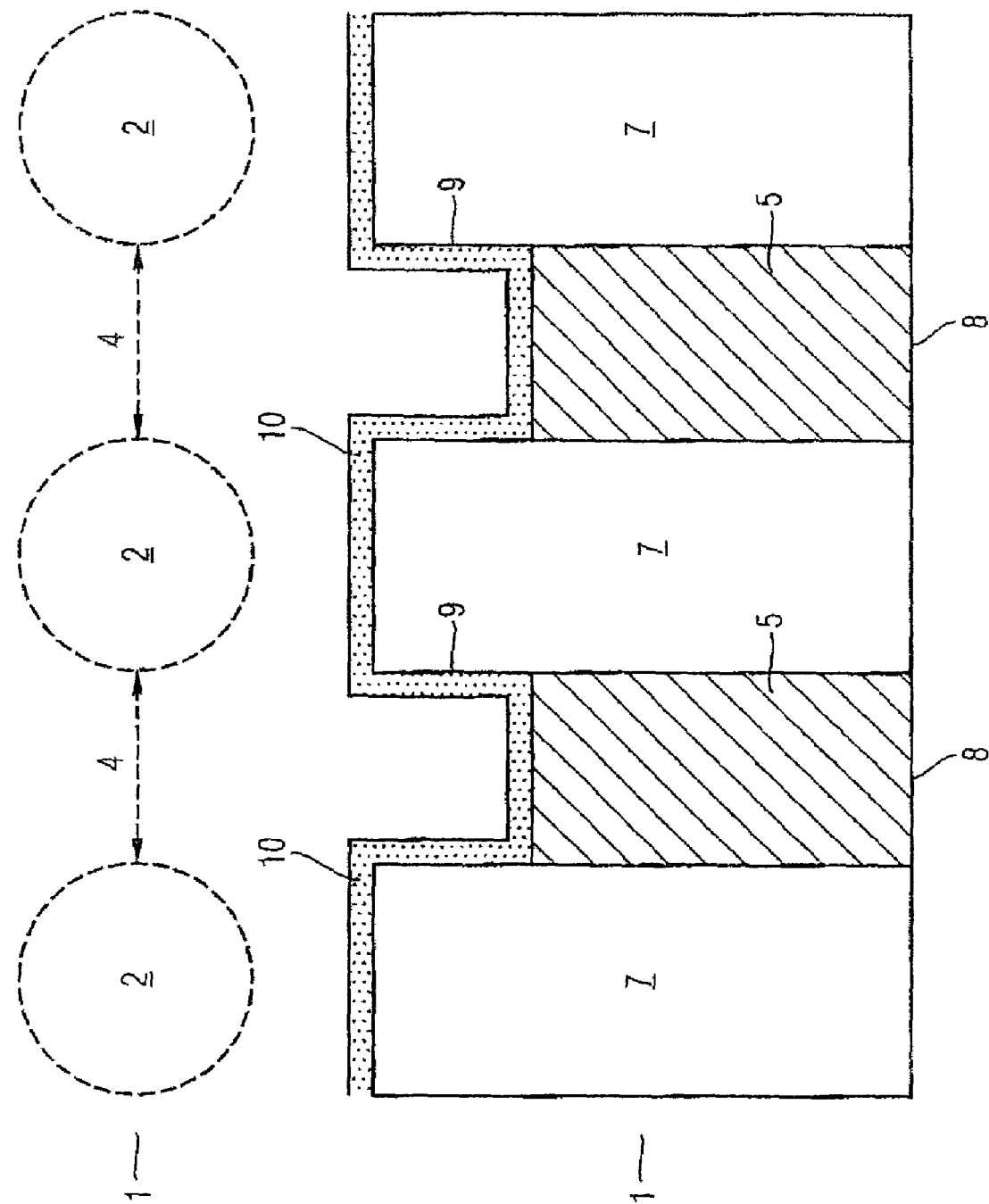
Figure 3C:
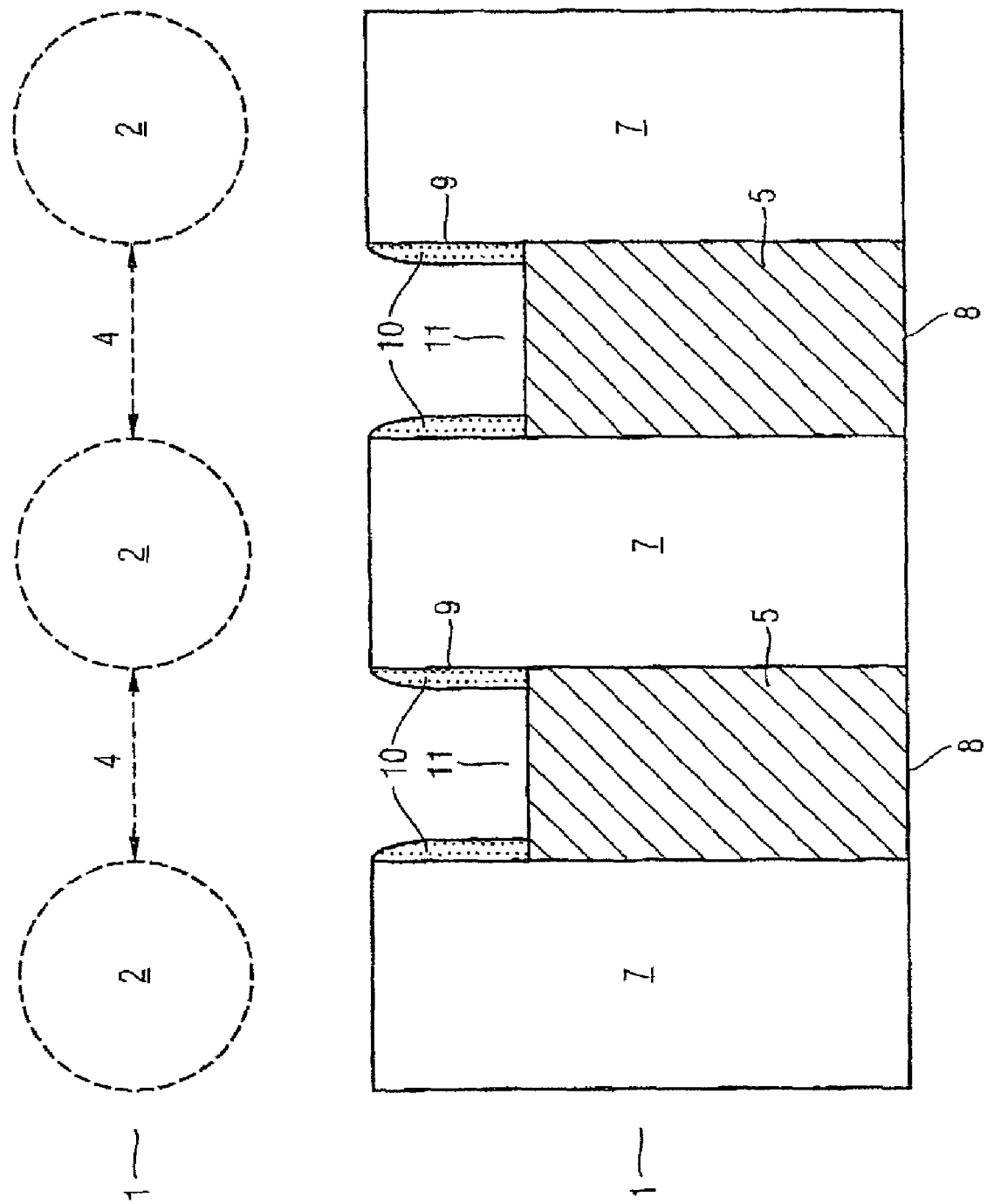
Figure 3D:
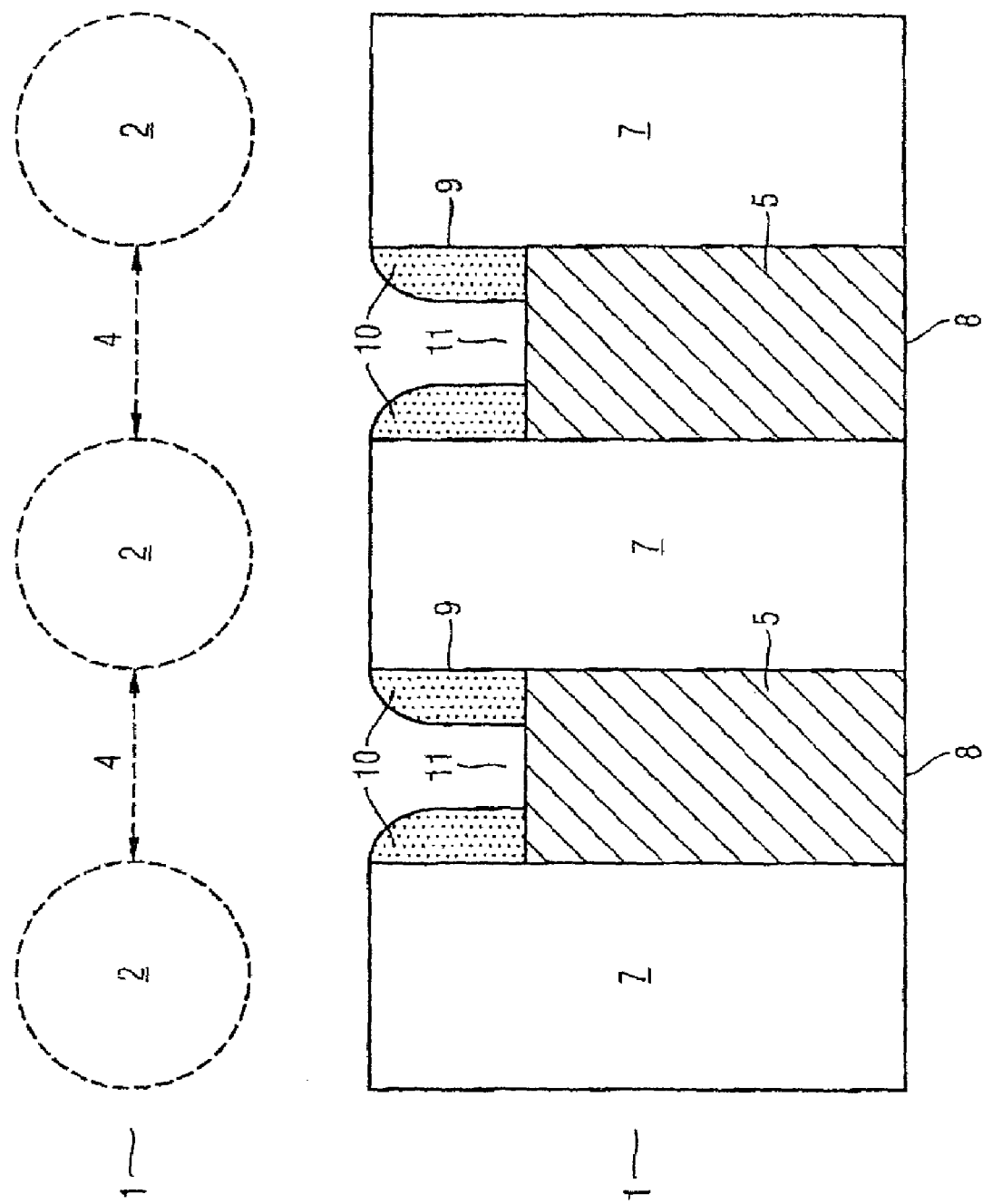
Figure 3E:
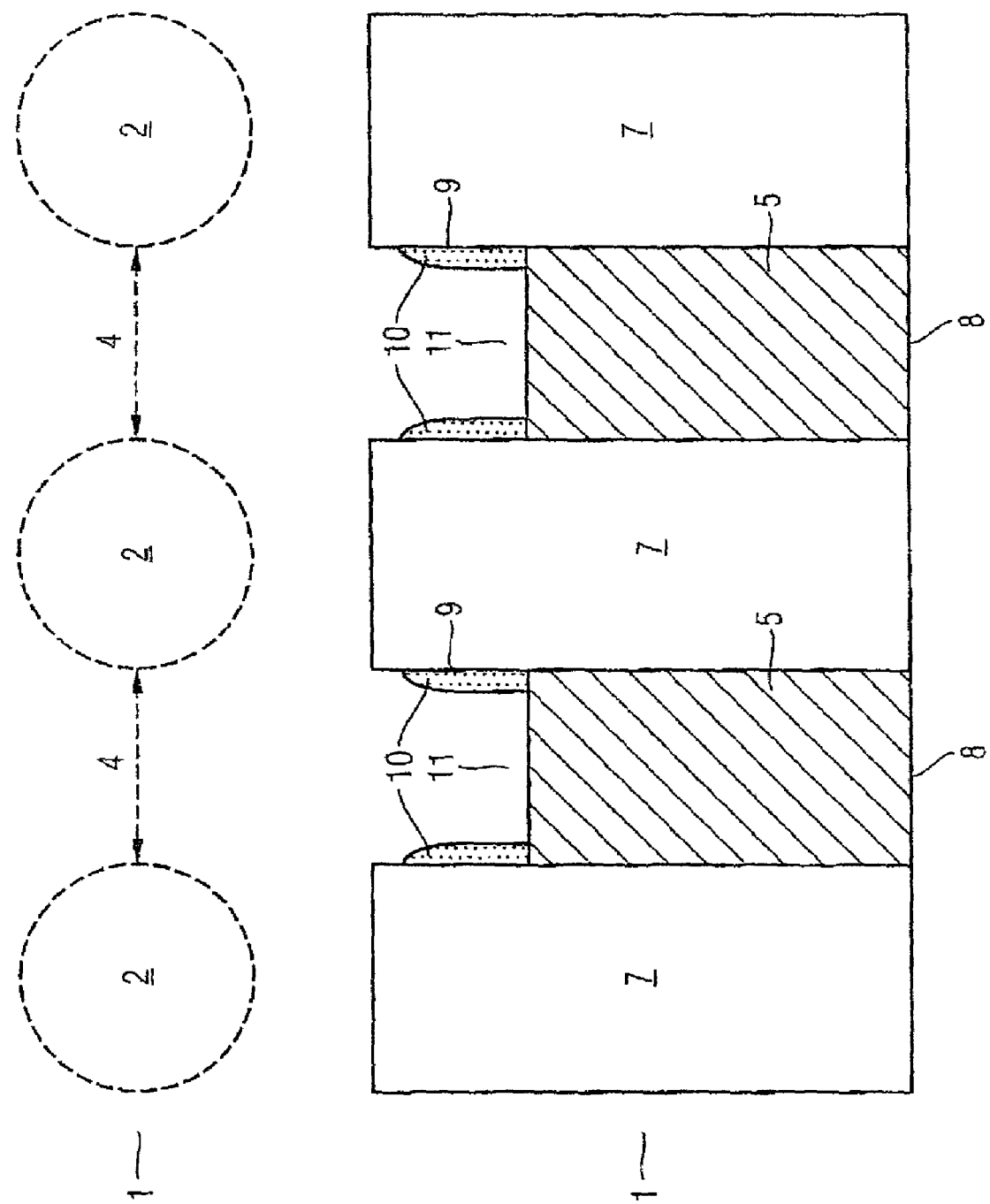

Analogously to this, FIGS. 3a-3c show schematic illustrations of successive method stages of a fabrication method of the first embodiment according to the present invention and where the stacked capacitors 2 that are adjacent in second directions 4 are illustrated. FIGS. 3d and 3e in each case show an alternative process sequence to the process sequence illustrated in FIG. 3c.

All of FIGS. 2, 3 and 4 show in the upper portion of the drawing a plan view and in the lower portion of the drawing a cross-sectional view of the respective method stage for fabricating a stacked capacitor array 1 according to the invention.

In this case, FIG. 2a shows the respective stacked capacitor 2 and its respective neighbors or the respective adjacent stacked capacitors 2 in the first directions 3 at an intermediate fabrication method stage. By contrast, FIG. 3a shows the respective stacked capacitor 2 and its respective neighbors in the second directions 4 in the same fabrication method stage. The same analogy holds true with regard to the method stage for FIGS. 2b and 3b, and also for FIGS. 2c and 3c.

In specific first directions 3, a stacked capacitor 2 has a smaller spacing from a respective adjacent stacked capacitors 2 than from the stacked capacitors 2 that are adjacent in diagonal or specific second directions 4.

FIG. 2a illustrates the stacked capacitors 2 in the first direction 3 spaced apart to a smaller extent. The cross-sectional view of FIG. 2a shows that a cylinder 7 for each stacked capacitor 2 is provided in the first auxiliary layer 5 in accordance with the regular arrangement (cf. FIG. 1 and FIG. 2a). The first auxiliary layer 5 is etched back in an upper region 9 of the intermediate regions 8 between the cylinders 7. An insulator 10 is deposited in the upper region 9 of the intermediate regions 8. FIG. 2a illustrates that the upper region 9 of the intermediate regions 8 (in directions 3) is completely filled by the insulator 10 in the first directions 3. By contrast FIG. 3a shows that the upper region 9 of the intermediate regions 8 is not completely filled by the insulator 10 in the second direction 4 on account of the larger spacing. The cylinder 7 may optionally be formed as a solid cylinder or as a hollow cylinder. The cylinder 7 serves as a first electrode of the capacitor.

FIGS. 2b and 3b show that the insulator 10 is partly etched back by means of an isotropic etching process. In accordance with FIGS. 2c and 3c, the insulator 10 is etched back by means of an anisotropic etching process, so that the insulator 10 remains in the upper region 9 of the intermediate regions 8 in the first directions 3 (cf. FIG. 2c) and so that in each case a hole 11 is formed through the insulator 10 between two stacked capacitors 2 that are adjacent in the second direction 4 (cf. FIG. 3c).

The first auxiliary layer 5 is subsequently removed by means of the holes 11 formed below the upper region 9 of the intermediate regions 8 (not shown). The stacked capacitor array 1 is finally completed by deposition of dielectric and a second or counterelectrode.

FIGS. 3d and 3e in each case show an alternative process sequence to the process sequence illustrated in FIG. 3c. According to FIG. 3d, the etching of the insulator 10 is carried out exclusively by means of an anisotropic etching process, as a result of which the insulator 10 remains thicker on the vertical regions of the upper region 9 of the intermediate regions 8. By contrast, in accordance with FIG. 3e, an isotropic etching process is carried out after the anisotropic etching, the insulator 10, being made significantly thinner on the vertical regions of the upper region 9 of the intermediate regions 8. In summary, it should be noted that, by means of the variable use of isotropic and anisotropic etching processes, the thickness of the insulator 10 can be set or controlled arbitrarily in order to avoid contact between the individual stacked capacitors 2. The insulator 10 may be completely removed by means of the holes 11 in the second directions 4, whereas in the first directions 3 the insulator 10 remains for spacing apart and supporting the stacked capacitors 2 that are adjacent in the first direction 3.

FIGS. 4a-4f show schematic illustrations of successive method stages of a fabrication method as a second embodiment of the present invention. FIGS. 4a-4f illustrate the respective stacked capacitors 2 and the adjacent stacked capacitors 2 exclusively in the first directions 3.

Figure 4A:
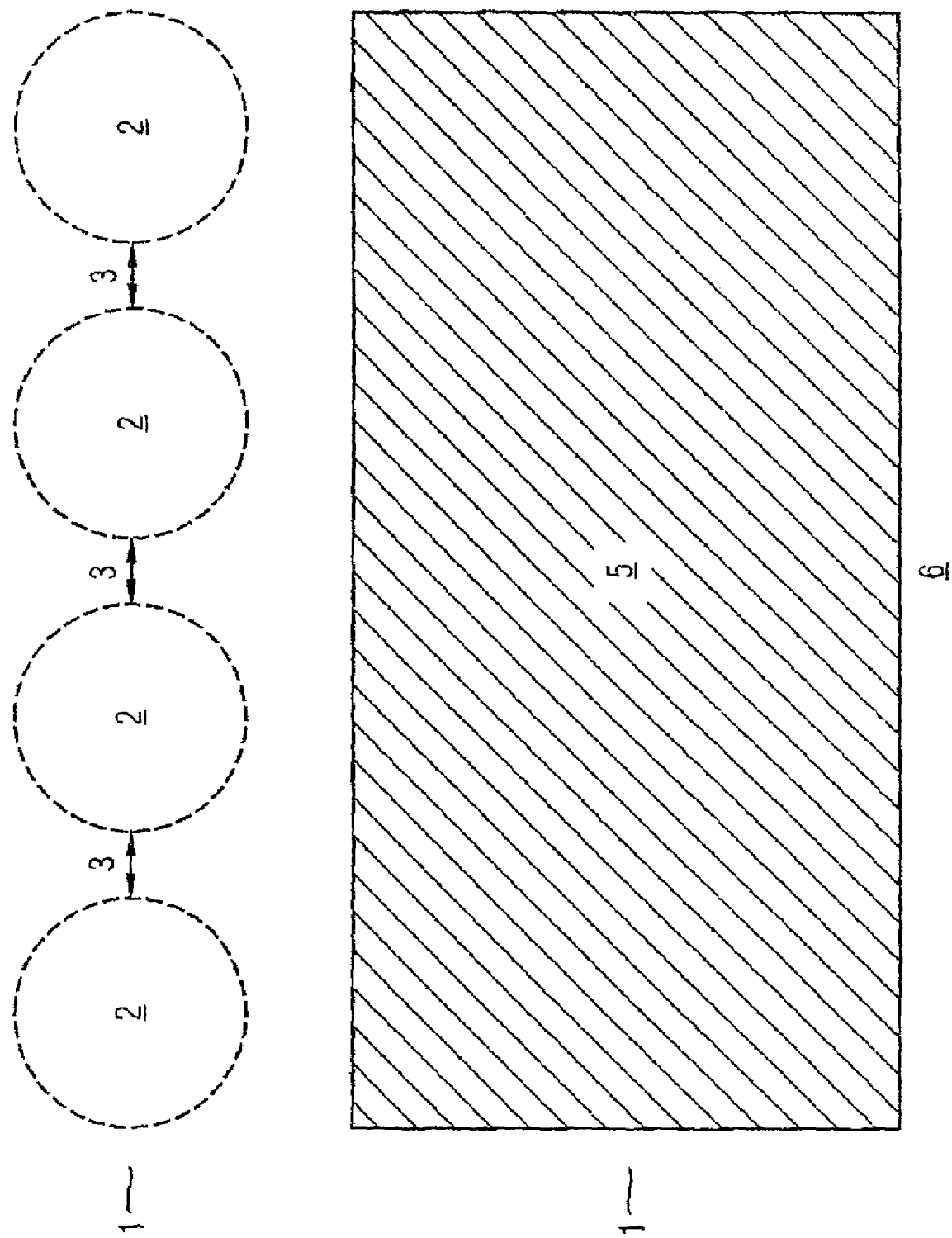

FIG. 4a shows that a first auxiliary layer 5 is provided on a substrate G. FIG. 4b illustrates that a respective hollow cylinder 7a is provided for each stacked capacitor 2 in the first auxiliary layer 5 in accordance with the regular arrangement (cf. in particular FIG. 1), the first auxiliary layer 5 remaining only in intermediate regions 8 between the hollow cylinders 7a after etching.

Figure 4D:
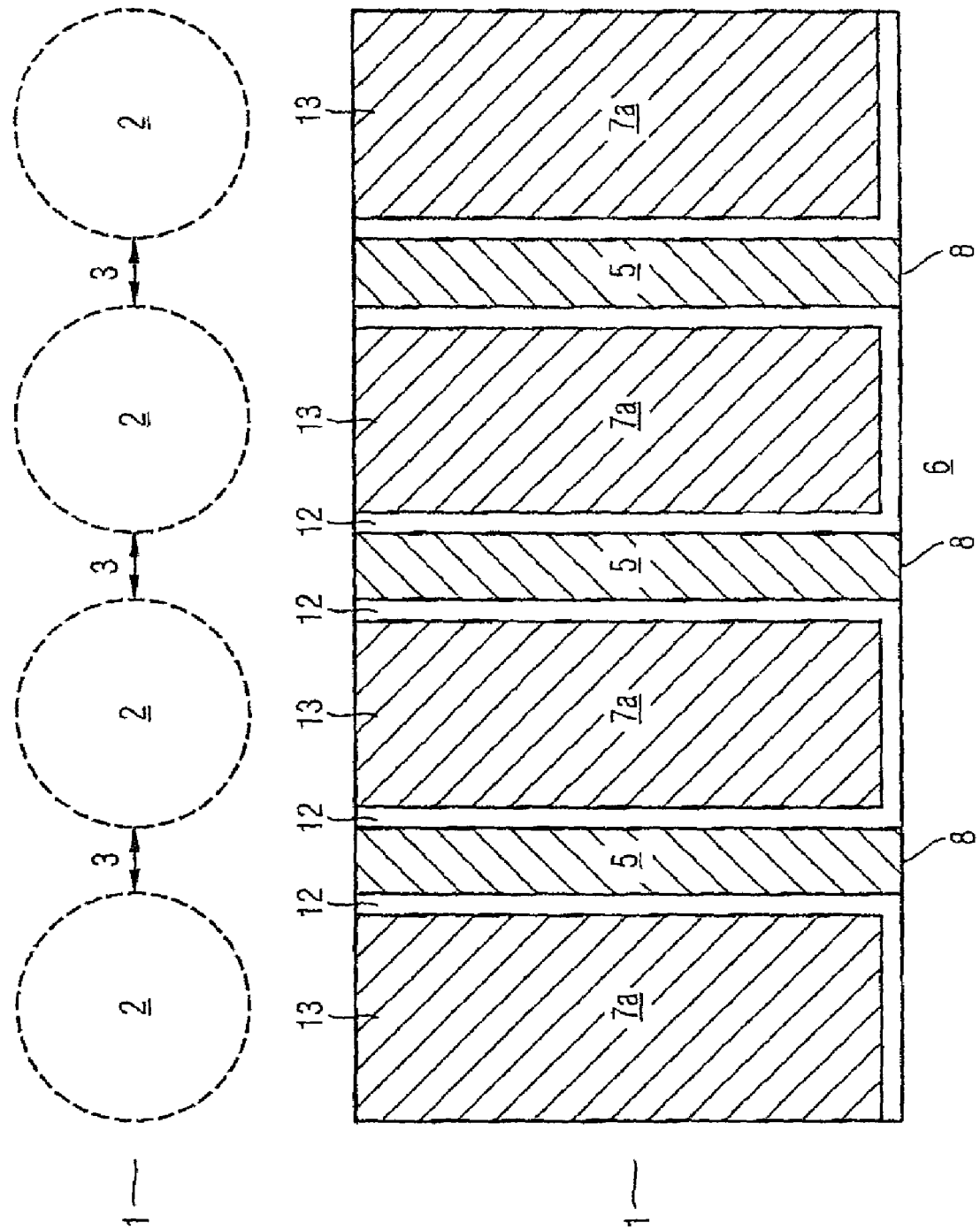

In accordance with FIG. 4c, a first electrode layer 12 is deposited into the hollow cylinders 7a for the purpose of forming the stacked capacitors 2. Referring to FIG. 4d, after the deposition of the electrode layer 12, the hollow cylinders 7a are filled with a first filling material 13. The first filling material 13 is preferably a dielectric formed by a silicate glass, by way of example. The surface is then planarized as shown in FIG. 4d.

Figure 4F:
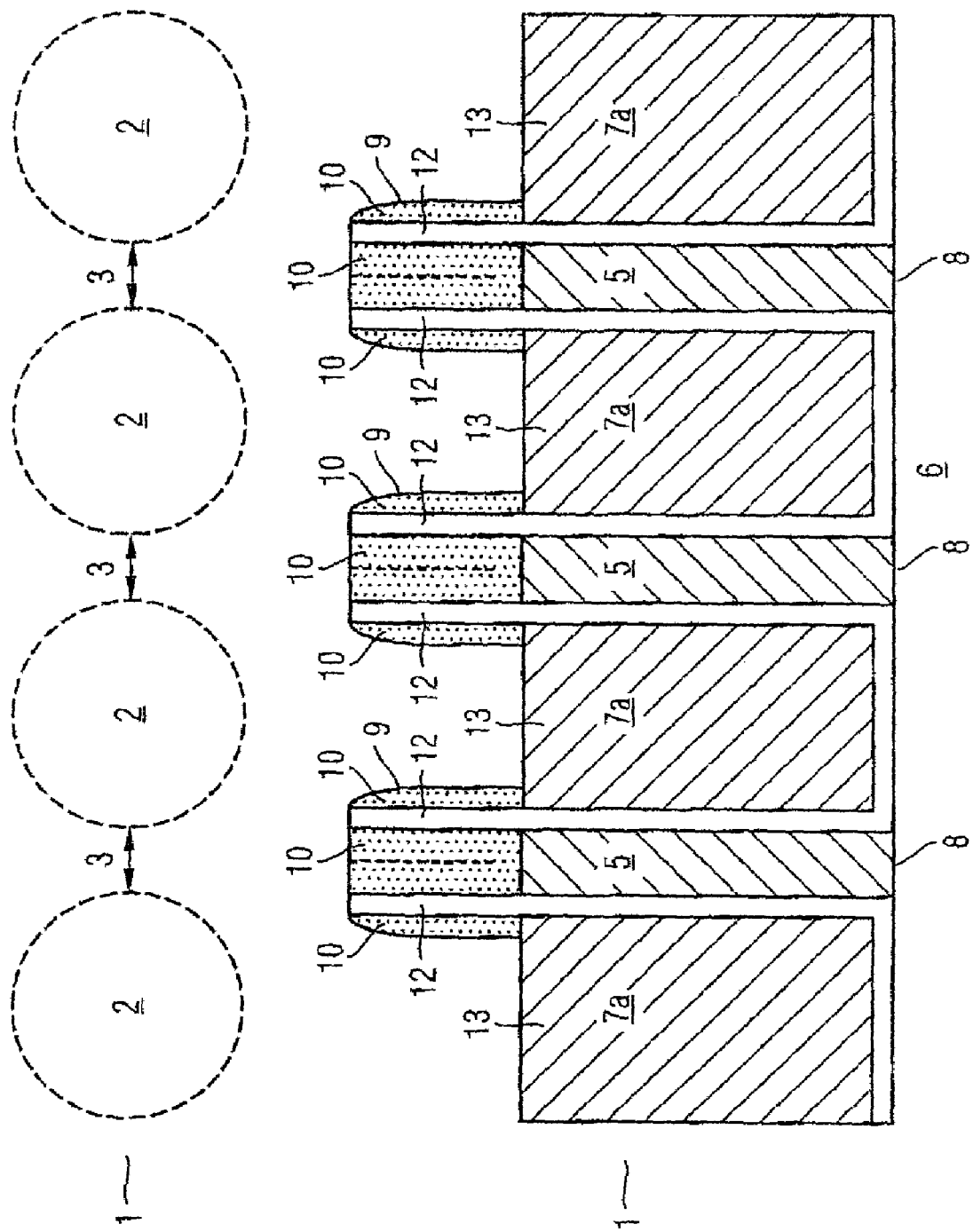

FIG. 4e shows that both the first auxiliary layer 5 in the intermediate regions 8 and the first filling 13 in the hollow cylinders 7a are etched back in an upper region 9 so as to leave hollow cylinders. Referring to FIG. 4f, an insulator 10 is deposited on the electrode layer 12 both in the upper region 9 in the intermediate regions 8, and within the hollow cylinders 7a such that the inside of the cylinder 7a and the intermediate region 8 between capacitors is as shown in FIG. 3a. The insulator 10 is subsequently etched back by means of an anisotropic and/or isotropic etching process, so that in each case the first filling 13 in the cylinder 7a is uncovered and a hole 11 (not shown) is formed through the insulating layer 10 between two stacked capacitors 2 that are adjacent in the second or diagonal direction 4 (cf. FIG. 3c) and on the inside of cylinder 7a. The insulator 10 has the function of spacing apart the individual adjacent stacked capacitors 2 from one another, so that the latter do not touch one another and, consequently, no electrical contact can arise between two stacked capacitors 2 and so that the mechanical stability is increased.

The auxiliary layer 5 is removed (cf. FIG. 4g) by means of the holes 11 (not shown), which are exclusively in the second direction 4 (cf. FIG. 3d and FIG. 1). Referring further to FIG. 4g, the first filling material 13 is removed, and the stacked capacitor array 1 is finally completed by deposition of the dielectric and the second or counterelectrode.

Although the present invention has been described above on the basis of preferred exemplary embodiments, it is not restricted thereto, but rather can be modified in diverse ways.

By way of example, it is not always necessary for the insulator to connect to one another two stacked capacitors that are adjacent in a direction spaced apart to a smaller extent. It is also possible for each stacked capacitor only to be surrounded with a ring comprising the insulator so that, in the case of stacked capacitors getting closer to one another, exclusively the rings comprising the insulator touch one another and no electrical contact can therefore arise between two stacked capacitors. Furthermore, the selection of the materials for the layers used is only by way of example; many other materials are conceivable and can be used.

The invention claimed is:

1. An array of stacked capacitors comprising:
a multiplicity of stacked capacitors aligned in at least two rows extending in one of two first specific but different directions such that the stack capacitors of adjacent rows are aligned in at least two columns extending in another one of said two first specific directions, said rows and said columns extending in said two first specific directions, each of said capacitors of said multiplicity having an electrode layer extending away from a surface of a substrate to an upper region and said electrode layer further defining a top portion at said upper region; and an insulator in said upper region and between at least one of said rows and said columns to provide spacing and to prevent the electrode layer of each of said stacked capacitors in said adjacent rows and columns from touching and such that there is no electrical contact.

2. The array of stacked capacitors according to claim 1, wherein the insulator fills a space between at least two adjacent stacked capacitors in one of said rows or said columns and thus provides mechanical stabilization.

3. The array of stacked capacitors according to claim 2, wherein the insulator does not fill the space between diagonally adjacent stack capacitors, and wherein said diagonal directions are second directions.

4. The array of stacked capacitors according to claim 1, wherein each of said stack capacitors has a smaller spacing from a respective adjacent stack capacitor in said specific first directions that lies along said rows and said columns than in specific second directions which are diagonal to said rows and said columns, the insulator keeping spaced apart at least two stacked capacitors that are adjacent in said first direction.

5. The array of stacked capacitors according to claim 1, wherein the stacked capacitors have a cylindrical shape.

6. The array of stacked capacitors according to claim 1, wherein each of said stacked capacitors is closely spaced to another capacitor and has a high aspect ratio.

7. The array of stacked capacitors according to claim 1, wherein the insulator is formed of silicon nitride.

8. The array of stacked capacitors according to claim 1, wherein the insulator is formed of aluminum oxide.

9. The array of stacked capacitors according to claim 1, wherein the insulator surrounds a corresponding stacked capacitor only in an insulating fashion and does not fill a space between two adjacent stacked capacitors to provide support.

10. The array of stacked capacitors according to claim 3, wherein the array of stacked capacitors comprises a regular arrangement arranged in checkered fashion, wherein each one of the first directions is perpendicular to one another and each one of the second directions is perpendicular to one another.

11. The array of stacked capacitors according to claim 5, wherein the cylindrical shape for each stacked capacitor is formed as a solid cylinder composed of an electrode material.

12. The array of stacked capacitors according to claim 5, wherein the cylindrical shape has an elliptical or a rectangular cross section.

13. The array of stacked capacitors according to claim 5, wherein the cylindrical shape has an inside and an outside, and wherein the insulator is deposited only on the outside of the cylindrical-shaped capacitors.

14. The array of stacked capacitors according to claim 5, wherein the insulator is deposited on both the inside and the outside of the cylindrical-shaped capacitors.

* * * * *